US005144186A

United States Patent [19]

Thurn et al.

[11] Patent Number: 5,144,186

[45] Date of Patent: Sep. 1, 1992

[54] ULTRASONIC SANDWICH TRANSDUCER WITH AN ASTIGMATIC SONIC LOBE

[75] Inventors: Rudolf Thurn, Kemnath; Hans-Joachim Burger, Kümmersbruck, both of Fed. Rep. of Germany

[73] Assignee: Siemens Aktiengesellschaft, Berlin & Munich, Fed. Rep. of Germany

[21] Appl. No.: 604,867

[22] Filed: Oct. 29, 1990

[30] Foreign Application Priority Data

Oct. 30, 1989 [EP] European Pat. Off. ........ 89120138.6

[51] Int. Cl.[5] .............................................. H01L 41/08

[52] U.S. Cl. ..................................... 310/326; 310/334; 310/335; 310/345

[58] Field of Search ................................ 310/334–337, 310/326, 327

[56] References Cited

U.S. PATENT DOCUMENTS

| | | | |
|---|---|---|---|
| 3,359,537 | 12/1967 | Geil et al. | 310/334 X |
| 3,928,777 | 12/1975 | Massa | 310/8.2 |
| 3,949,348 | 4/1976 | Dorr | 340/8 R |
| 4,190,783 | 2/1980 | Massa | 310/335 X |
| 4,316,115 | 2/1982 | Wilson et al. | 310/334 |
| 4,409,510 | 10/1983 | Assenza et al. | 310/334 |
| 4,571,520 | 2/1986 | Saito et al. | 310/327 |

FOREIGN PATENT DOCUMENTS 0896272 11/1953 Fed. Rep. of Germany .

OTHER PUBLICATIONS

Navy Technical Disclosure Bulletin, vol. 4, No. 4, Apr. 1979, pp. 25-28; Arlington, US; C. H. Jones et al.: "Sidelobe Suppressors".

*Primary Examiner*—Mark O. Budd
*Attorney, Agent, or Firm*—Kenyon & Kenyon

[57] ABSTRACT

In an ultrasonic sandwich transducer having an astigmatic sonic lobe, a small rectangular piezoceramic plate is operated on the fourth planar vibrational mode. To prevent the creation of secondary lobes that lead to spurious signals, damping elements are applied to the longitudinal ends of the ultrasonic sandwich transducer. These types of ultrasonic sandwich transducers find application, in ultrasonic proximity switches.

11 Claims, 1 Drawing Sheet

ULTRASONIC SANDWICH TRANSDUCER WITH AN ASTIGMATIC SONIC LOBE

BACKGROUND OF THE INVENTION

The invention relates generally to ultrasonic sandwich transducers of the type producing an astigmatic sonic lobe. Such transducers have at least one small rectangular piezoceramic plate, covered on both sides with one layer of material, whereby the longitudinal side of the ultrasonic sandwich transducer serves as a sound transmission surface and the ultrasonic sandwich transducer is operated on the fourth planar vibrational mode of the small piezoceramic plate. More particularly, the invention relates to such a transducer having improved operating characteristics.

This general type of ultrasonic sandwich transducer is used in wide-angle proximity sensors. The operation of the small piezoceramic plates on the fourth planar vibrational mode enables such structure to achieve a high degree of efficiency for acoustic emission and reception. However, this mode has the disadvantage of generating out of phase vibrations at the longitudinal ends of the sound transmission surface. As a result, strong secondary lobes are generated in addition to the desired narrow sonic lobe in the plane parallel to the orientation of the small piezoceramic plates. This can lead to spurious signals due to interference reflectors lying outside of the principal detecting range.

This invention is directed to the problem of creating an ultrasonic sandwich transducer for wide-angle proximity sensors which is suitable for industrial application, and in which the problems caused by the generation of undesired secondary lobes is reduced.

SUMMARY OF THE INVENTION

This invention solves this problem of ultrasonic sandwich transducer of the above-mentioned type by applying damping elements to the longitudinal ends of the ultrasonic sandwich transducer. The damping elements are advantageously designed as U-shaped damping plates surrounding the ends of the ultrasonic sandwich transducer. The manufacturing process is simplified by providing the damping plates with at least one slot to accommodate the small piezoceramic plate. The damping elements are made of an elasticized polymer containing filler material that provides good damping characteristics. A polymer and filler composite having density of 1.5 to 4.5 g/cm$^3$ provides the desired vibrational properties.

The layers usually provided on both sides of the small piezoceramic plate consist of the plastic polyethylene. Unfortunately, the mechanical material properties of polyethylene exhibit a strong variation with temperature, thus causing significant frequency drift during temperature changes It is advantageous to use an epoxy resin filled with hollow-glass spheres as the layer material in order to reduce this temperature dependant variation in frequency One may further favorably influence the directivity characteristic and/or the efficiency factor of the acoustic transmission by providing a matching layer on the sound-radiating front side of the transducer. This matching layer can be easily manufactured if one uses an epoxy resin filled with hollow-glass spheres as the matching layer material. Since the desired form of the sonic lobe depends on the geometry of the matching layer, it is advantageous to provide varying geometries for the matching layer. The efficiency factor of the transducer is thus enhanced by providing matching layers of differing thickness.

When the transducer is manufactured by bonding component parts, reactive adhesive agents should preferably be used to achieve proper bonding. However, this manufacturing method requires extensive and exacting manual work, which complicates the manufacturing process and makes it more expensive. To avoid this, it is advantageous to use a method for manufacturing the ultrasonic sandwich transducer of the above-mentioned design in which the damping elements are cast with a casting mold. After the casting mold cavity is filled with liquid epoxy resin filled with hollow-glass spheres, one inserts the small piezoceramic plate into the grooves of the loading plates designed to be used as damping elements. One then subsequently cures the ultrasonic sandwich transducer.

DETAILED DESCRIPTION

Figure 1:
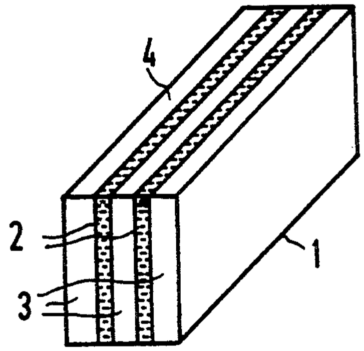
FIG. 1 illustrates a perspective view of a known ultrasonic sandwich transducer.

FIG. 1 depicts an ultrasonic sandwich transducer 1 of a known construction having two small piezoceramic plates on whose two sides layers 3 of the plastic polyethylene have been applied. The astigmatic directivity characteristic of the sonic lobe is attained by using the longitudinal side 4 of the ultrasonic sandwich transducer 1 as a sound-radiating surface. In this connection, the ratio of length to width of this rectangular surface is proportional to the ratio of the acceptance angle from narrower to wider sonic lobe. The ultrasonic sandwich transducer 1 is resonantly operated on the fourth planar vibrational mode of the small piezoceramic plates 2, through which means a high efficiency factor is attained for sound transmission and reception. In this mode, however, out of phase vibrations disadvantageously arise at the longitudinal ends of the sound-radiating surface. These vibrations lead to strong secondary lobes in the narrow sonic lobe in the plane parallel to the orientation of the small piezoceramic plates 2. This can lead to spurious signals as the result of interference reflectors lying outside of the principal detecting range. By applying damping plates 5 to the longitudinal ends of the sound-radiating surface of the transducer 1, the out of phase vibrations are damped, so that virtually no more secondary lobes develop.

As noted above, the use of polyethylene as the layer material produces a strong frequency drift during temperature changes, since the mechanical material parameters of polyethylene exhibit a strong temperature dependance. To correct such temperature dependance, a costly electronic frequency correction is required for applications in proximity sensors.

Figure 2:
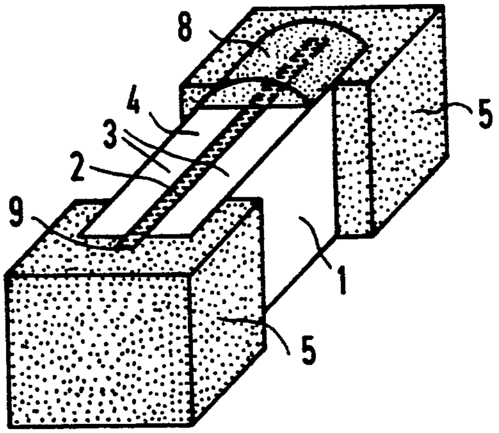
FIG. 2 shows an ultrasonic sandwich transducer constructed according to the principles of the invention.

FIG. 2 depicts an ultrasonic sandwich transducer, which has damping plates 5 located at the longitudinal ends of the layers 3. These damping plates are formed in a U-shape and have a groove 9 to accommodate the small piezoceramic plate 2 protruding over the ends. A strongly damping, elasticized polymer, brought to a density of 1.5 to 4.5 g/cm$^3$ by means of appropriate fillers, is preferably used for the damping plates 5. The damping plates 5 are formed by means of casting or injection molding. Alternately, they may be manufactured from bands using cutting and grinding methods. By surrounding the transducer ends with U-shaped damping plates 5, one achieves good damping of secondary lobes in the narrow sonic lobe of the ultrasonic sandwich transducer.

In this specific embodiment, the layers 3 serving as composite material are manufactured from an epoxy resin filled with hollow-glass spheres. Such an epoxy resin with hollow-glass spheres is also known as "syntactic foam". Through this means and with otherwise constant acoustical properties, the temperature variation of the frequency is improved from ±10 kHz to ±2 kHz in the range from −25° C. to 70° C.

The ultrasonic sandwich transducer according to FIG. 2 has a matching layer 8 on the sound-radiating front side of the transducer, as indicated. The matching layer is also advantageously manufactured out of a syntactic foam, which is easy to work and thus can easily be formed into a geometry adapted to the desired sonic lobe form. The geometry can, for example, be even, rounded off or beveled, or roof-shaped. In addition, the transducer's efficiency factor can be improved by optimizing the thickness of the matching layer 8.

The described ultrasonic sandwich transducer according to FIG. 2 can be manufactured from its component parts using bonding means, preferably reactive adhesive agents. However, this manufacturing method requires exacting manual work, which entails a great deal of effort and is therefore quite expensive. The manufacturing process can be considerably facilitated by manufacturing the described configuration using the casting method. In this case, for example, the damping plates 5 are introduced into a casting mold, whose free space corresponds to the outer geometry of the resulting transducer. The damping plates possess grooves 9 to accommodate and guide the small piezoceramic plate 2. This piezoceramic plate 2 is inserted after the casting mold cavity is filled with still-liquid syntactic foam. After curing, the manufacturing process is largely complete and the ultrasonic sandwich transducer 1 can be removed from the casting mold.

For some applications, ultrasonic sandwich transducers 1 are required that have several small piezoceramic plates 2. In this case, these plates are lined up together on one side, so that a layer 3 of syntactic foam is situated between each of them. In the damping plates 5, several grooves 9 are provided in accordance with the number of small piezoceramic plates 2 to accommodate the same.

What is claimed is:

1. An ultrasonic sandwich transducer with an astigmatic sonic lobe, comprising:

at least one small rectangular piezoceramic plate;

first and second layers of material, one on each side of said plate to thereby form a sandwich structure having a longitudinal side and longitudinal ends; and first and second damping elements that each include means for damping out-of-phase vibrations such that secondary lobes are not generated, said damping elements being disposed at the longitudinal ends of said sandwich structure, whereby when the ultrasonic sandwich transducer is operated on the fourth planar vibrational mode of the small piezoceramic plate, the longitudinal side of the ultrasonic sandwich transducer serves as a sound transmission surface.

2. The ultrasonic sandwich transducer according to claim 1, wherein the damping elements are U-shaped damping plates that surround the ends of the ultrasonic sandwich transducer.

3. The ultrasonic sandwich transducer according to claim 2, wherein the damping plates have at least one groove to accommodate the small piezoceramic plate.

4. The ultrasonic sandwich transducer according to claim 1, wherein the damping elements are made of an elasticized polymer containing filler material.

5. The ultrasonic sandwich transducer according to claim 4, wherein the polymer and filler has a density of between 1.5 to 4.5 g/cm$^3$.

6. The ultrasonic sandwich transducer according to claim 1, wherein said first and second layers comprise an epoxy resin filled with hollow-glass spheres.

7. The ultrasonic sandwich transducer according to claim 1, and further comprising a matching layer on the sound-radiating front side of the transducer.

8. The ultrasonic sandwich transducer according to claim 7, wherein the matching layer comprises an epoxy resin filled with hollow-glass spheres.

9. The ultrasonic sandwich transducer according to claim 7, wherein the shape of the matching layer is selected from one of a plurality of geometries.

10. The ultrasonic sandwich transducer according to claim 8, wherein the shape of the matching layer is selected from one of a plurality of geometries.

11. The ultrasonic sandwich transducer according to claim 7, wherein the thickness of the matching layer is selected from one of a plurality of thicknesses.

* * * * *